United States Patent
Kim et al.

(10) Patent No.: US 11,932,784 B2
(45) Date of Patent: Mar. 19, 2024

(54) ADHESIVE COMPOSITION FOR DICING TAPE AND DICING TAPE COMPRISING THE SAME

(71) Applicant: LG CHEM, LTD., Seoul (KR)

(72) Inventors: Da Ae Kim, Daejeon (KR); Ji Ho Han, Daejeon (KR); Kwang Joo Lee, Daejeon (KR); Eun Yeong Kim, Daejeon (KR); Mi Jang, Daejeon (KR)

(73) Assignee: LG CHEM, LTD., Seoul (KR)

(*) Notice: Subject to any disclaimer, the term of this patent is extended or adjusted under 35 U.S.C. 154(b) by 96 days.

(21) Appl. No.: 17/598,114

(22) PCT Filed: Aug. 13, 2020

(86) PCT No.: PCT/KR2020/095102
§ 371 (c)(1),
(2) Date: Sep. 24, 2021

(87) PCT Pub. No.: WO2021/060960
PCT Pub. Date: Apr. 1, 2021

(65) Prior Publication Data
US 2022/0186092 A1    Jun. 16, 2022

(30) Foreign Application Priority Data
Sep. 26, 2019 (KR) .......... 10-2019-0119119
Jul. 31, 2020 (KR) .......... 10-2020-0096318

(51) Int. Cl.
| | | |
|---|---|---|
| *C09J 133/08* | (2006.01) | |
| *C08K 5/00* | (2006.01) | |
| *C08K 5/03* | (2006.01) | |
| *C09J 7/24* | (2018.01) | |
| *C09J 7/25* | (2018.01) | |
| *C09J 11/06* | (2006.01) | |
| *H01L 21/683* | (2006.01) | |

(52) U.S. Cl.
CPC .......... *C09J 133/08* (2013.01); *C08K 5/0025* (2013.01); *C08K 5/03* (2013.01); *C09J 7/24* (2018.01); *C09J 7/241* (2018.01); *C09J 7/25* (2018.01); *C09J 11/06* (2013.01); *H01L 21/6836* (2013.01); *C08K 5/005* (2013.01); *C08K 2201/012* (2013.01); *C09J 2203/326* (2013.01); *C09J 2301/302* (2020.08); *C09J 2301/312* (2020.08); *C09J 2301/408* (2020.08); *C09J 2423/006* (2013.01); *C09J 2433/00* (2013.01); *H01L 2221/68327* (2013.01)

(58) Field of Classification Search
None
See application file for complete search history.

(56) References Cited

U.S. PATENT DOCUMENTS

| | | | |
|---|---|---|---|
| 7,070,051 B2 * | 7/2006 | Kanner | A61B 17/06133 |
| | | | 206/460 |
| 7,687,569 B2 | 3/2010 | Glöckner et al. | |
| 8,816,485 B2 | 8/2014 | Apanius et al. | |
| 9,761,476 B2 | 9/2017 | Kim et al. | |
| 10,192,768 B2 * | 1/2019 | Yamashita | C08K 5/0075 |
| 10,324,260 B1 * | 6/2019 | Evans | C09J 9/00 |
| 2012/0270142 A1 | 10/2012 | Lee et al. | |
| 2016/0060489 A1 | 3/2016 | Kim et al. | |
| 2020/0347230 A1 | 11/2020 | Ogawa et al. | |

FOREIGN PATENT DOCUMENTS

| | | | |
|---|---|---|---|
| CN | 101679829 A * | 3/2010 | .......... C08G 59/686 |
| CN | 109355037 A | 2/2019 | |
| CN | 109401689 A | 3/2019 | |
| JP | 3595056 B2 * | 12/2004 | |
| JP | 2007-238802 A | 9/2007 | |
| JP | 2016-196614 A | 11/2016 | |
| JP | 2017-508304 A | 3/2017 | |
| KR | 10-1994-0007150 A | 4/1994 | |
| KR | 10-0479893 B1 | 6/2005 | |
| KR | 10-2007-0038984 A | 4/2007 | |
| KR | 10-1002089 B1 | 12/2010 | |
| KR | 10-1019756 B1 | 3/2011 | |
| KR | 10-2012-0118600 A | 10/2012 | |
| KR | 10-1236151 B1 | 2/2013 | |
| KR | 10-1722137 B1 | 3/2017 | |
| WO | 2019-043056 A1 | 3/2019 | |
| WO | 2019-084397 A | 5/2019 | |

OTHER PUBLICATIONS

Machine translation of CN109355037A (Year: 2019).*
Machine translation of JP_3595056_B2 (Year: 2004).*
Machine translation of CN 101679829 A (Year: 2010).*
International Search Report issued for International Application No. PCT/KR2020/095102 dated Nov. 26, 2020, 4 pages.

* cited by examiner

*Primary Examiner* — Frank D Ducheneaux
(74) *Attorney, Agent, or Firm* — ROTHWELL, FIGG, ERNST & MANBECK, P.C.

(57) ABSTRACT

The present invention provides an adhesive composition for a dicing tape, which may prevent the success rate of chip pick-up from decreasing due to an oxygen inhibition phenomenon occurring in a dicing process, and a dicing tape including the same. The adhesive composition for a dicing tape includes an adhesive binder, a singlet oxygen scavenger, a photosensitizer, and a photoinitiator.

12 Claims, No Drawings

ADHESIVE COMPOSITION FOR DICING TAPE AND DICING TAPE COMPRISING THE SAME

CROSS-REFERENCE TO RELATED APPLICATION(S)

This application is a 35 U.S.C. 371 National Phase Entry Application from PCT/KR2020/095102, filed on Aug. 13, 2020 and designating the United States, which claims priority to Korean Patent Application No. 10-2019-0119119, filed in the Korean Intellectual Property Office on Sep. 26, 2019 and Korean Patent Application No. 10-2020-0096318, filed in the Korean Intellectual Property Office on Jul. 31, 2020, the disclosure of which are incorporated herein by reference in their entirety.

BACKGROUND

1. Technical Field

The present invention relates to an adhesive composition for a dicing tape and a dicing tape including the same.

2. Background of the Invention

In general, semiconductor chip fabrication processes include a process of forming a fine pattern on a wafer and a packaging of polishing and packaging the wafer to meet the specifications of the final device.

The packaging process includes: a wafer inspection process of inspecting defects in a semiconductor chip; a dicing process of separating a wafer into individual chips by cutting; a die bonding process of attaching the individual chips to the mounting board of a circuit film or a lead frame; a wire bonding process of connecting a chip pad provided on the semiconductor chip to the circuit pattern of the circuit film or lead frame by electrical connecting means such as wire; a molding process of encapsulating the semiconductor chip with an encapsulation material to protect the internal circuit and other parts of the semiconductor chip; a trimming process of cutting a dam bar connecting leads; a forming process of bending the leads into a desired form; and a final product inspection process of inspecting defects in a packaged product.

In the dicing process, the wafer is cut to a predetermined thickness by a diamond wheel or the like. Before the dicing process, a dicing tape is laminated onto the backside of the wafer under suitable conditions to secure the wafer, and then the dicing process is performed. In addition, a die bonding film (adhesive film) is used to attach the diced individual chips to a circuit board. Through the dicing process, separate individual chips are produced from the semiconductor wafer having a plurality of chips formed therein. In a broad sense, the dicing process is a process of producing a plurality of separate individual chips by grinding the backside of a semiconductor wafer and cutting the semiconductor wafer along a dicing line between the chips.

In addition, in a conventional cutting process, there is a problem that the yield is lowered due to damage to the chip. To solve this problem, a fabrication process including an expanding process which is performed after cutting a semiconductor chip with a blade has been suggested. In this fabrication process, the cut semiconductor wafer is expanded, the base film of the semiconductor wafer is irradiated with ultraviolet (UV) light, and a plurality of individual chips is picked up.

However, during the expanding process, a die-lift phenomenon occurs in which the periphery of the cut chip is lifted, and oxygen is trapped in the lifted portion. Thereafter, a radical generated in the process of irradiating UV light reacts with the trapped oxygen to form a peroxyl radical, and thus an oxygen inhibition phenomenon occurs at the periphery of the chip. The surface where the oxygen inhibition phenomenon has occurred remains having high adhesion, and when the chips are picked up, a problem arises in that the success rate of pick-up of chips is decreased due to fixation between films.

BRIEF SUMMARY OF THE INVENTION

An object of the present invention is to provide an adhesive composition for a dicing tape capable of preventing the success rate of chip pick-up from being decreased by the oxygen inhibition phenomenon occurring in the dicing process, and a dicing tape including the adhesive composition for a dicing tape.

However, objects which are to be achieved by the present invention are not limited to the above-mentioned object, and other objects which are not mentioned will be clearly understood by those skilled in the art from the following description.

One embodiment of the present invention provides an adhesive composition for a dicing tape including: an adhesive binder; a singlet oxygen scavenger; a photosensitizer; and a photoinitiator.

Another embodiment of the present invention provides a dicing tape including: a base film; and an adhesive layer formed on at least one surface of the base film, wherein the adhesive layer includes the adhesive composition for a dicing tape.

DETAILED DESCRIPTION OF THE INVENTION

The terms used in the present specification and the appended claims should not be interpreted as being limited to general meanings or dictionary definitions, but should be interpreted as having meanings and concepts relevant to the technical scope of the present invention, based on the principle according to which the inventors can appropriately define the meaning of the terms to describe their invention in the best manner.

Accordingly, it should be understood that the embodiments described in the present specification are merely the most preferred example of the present invention, but do not cover all the technical spirits of the present invention, and thus there may be various equivalents and modifications capable of replacing them at the time of filing of the present invention.

Throughout the present specification, it is to be understood that when any part is referred to as "including" any component, it does not exclude other components, but may further include other components, unless otherwise specified.

Throughout the present specification, when any member is referred to as being "on" another member, it not only refers to a case where any member is in contact with another member, but also a case where a third member exists between the two members.

Throughout the present specification, the unit "parts by weight" may refer to the ratio of weight between components.

Throughout the present specification, the term "(meth) acrylate" is used as a collective term for acrylate and methacrylate.

Throughout the present specification, the "weight-average molecular weight" and "number-average molecular weight" of any compound may be calculated using the molecular weight and molecular weight distribution of the compound. Specifically, the molecular weight and molecular weight distribution of the compound may be obtained by:

placing tetrahydrofuran (THF) and the compound in a 1-ml glass vial to prepare a test sample in which the concentration of the compound is 1 wt %; filtering a standard sample (polystyrene) and the test sample through a filter (pore size: 0.45 μm); injecting each of the sample filtrates into a GPC injector; and comparing the elution time of the test sample with a calibration curve of the standard sample. At this time, Infinity II 1260 (Agilent Technologies, Inc.) may be used as a measurement instrument, and the flow rate and the column temperature may be set at 1.00 mL/min and 40.0° C., respectively.

Throughout the present specification, "glass transition temperature (Tg)" may be measured using differential scanning analysis (DSC). Specifically, the glass transition temperature may be measured using DSC (Differential Scanning calorimeter, DSCQ2000, TA Instrument Korea) by heating a sample within a temperature range of −60° C. to 150° C. at a heating rate of 5° C./min, performing a two-cycle experiment within the temperature range, and measuring the midpoint of the DSC curve plotted as the point where the amount of heat change is present.

In an expanding process of a conventional dicing process, a die-lift phenomenon occurs in which the periphery of a cut chip is lifted, and oxygen is trapped in the lifted portion. Thereafter, a radical generated in a process of irradiating ultraviolet (UV) light reacts with the trapped oxygen to form a peroxyl radical, and thus an oxygen inhibition phenomenon occurs at the periphery of the chip. The surface where the oxygen inhibition phenomenon has occurred remains having high adhesion, and when the chips are picked up, a problem arises in that the success rate of pick-up of chips is decreased due to fixation between films.

One embodiment of the present invention provides an adhesive composition for a dicing tape including: an adhesive binder, a singlet oxygen scavenger; a photosensitizer; and a photoinitiator.

As the adhesive composition for a dicing tape according to the present invention further includes the singlet oxygen scavenger and the photosensitizer, the photosensitizer may convert atmospheric oxygen into singlet oxygen upon UV light irradiation, and the singlet oxygen scavenger may react with the converted singlet oxygen, thereby removing oxygen that reacts with a radical. Thus, the oxygen inhibition phenomenon may be mitigated.

According to one embodiment of the present invention, the adhesive binder may include a (meth)acrylate-based resin having a glass transition temperature of −28° C. to −58° C., −29° C. to −57° C., −30° C. to −56° C., −30° C. to −55° C., −31° C. to −54° C., −32° C. to −53° C., −33° C. to −52° C., −34° C. to −51° C., or −35° C. to −50° C. As the adhesive binder is selected as described above, it is possible to control the adhesive force of the adhesive composition, and the concentration at which atmospheric oxygen generates singlet oxygen may be controlled by the photosensitizer included in the adhesive composition.

According to one embodiment of the present invention, the (meth)acrylate-based resin may include a copolymer of a (meth)acrylic ester-based monomer and a crosslinkable functional group-containing monomer. As the (meth)acrylate-based resin includes the above-described copolymer, it is possible to realize the basic physical properties of the adhesive layer.

According to one embodiment of the present invention, the (meth)acrylic ester-based monomer may be alkyl (meth) acrylate. More specifically, the (meth)acrylic ester-based monomer may be one or a mixture of two or more of pentyl (meth)acrylate, n-butyl (meth)acrylate, ethyl (meth)acrylate, methyl (meth)acrylate, hexyl (meth)acrylate, n-octyl (meth) acrylate, isooctyl (meth)acrylate, 2-ethylhexyl (meth)acrylate, dodecyl (meth)acrylate, and decyl (meth)acrylate, which are monomers having an alkyl group containing 1 to 12 carbon atoms. As the (meth)acrylic ester-based monomer is selected from those described above, it is possible to realize the basic physical properties of the adhesive layer.

According to one embodiment of the present invention, the crosslinkable functional group-containing monomer may be one or a mixture of two or more of a hydroxyl group-containing monomer, a carboxyl group-containing monomer and a nitrogen-containing monomer. As the crosslinkable functional group-containing monomer is selected from those described above, it is possible to realize the basic physical properties of the adhesive layer.

According to one embodiment of the present invention, the hydroxyl group-containing monomer may be 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 2-hydroxyethylene glycol (meth)acrylate, or 2-hydroxypropylene glycol (meth)acrylate. As the hydroxyl group-containing monomer is selected from those descried above, it is possible to realize the basic physical properties of the adhesive layer.

According to one embodiment of the present invention, the carboxyl group-containing monomer may be (meth) acrylic acid, 2-(meth)acryloyloxyacetic acid, 3-(meth)acryloyloxypropionic acid, 4-(meth)acryloyloxybutyric acid, an acrylic acid dimer, itaconic acid, maleic acid, or maleic anhydride. As the carboxyl group-containing monomer is selected from those described above, it is possible to realize the basic physical properties of the adhesive layer.

According to one embodiment of the present invention, the nitrogen-containing monomer may be (meth)acrylonitrile, N-vinyl pyrrolidone, or N-vinyl caprolactam. As the nitrogen-containing monomer is selected from those described above, it is possible to realize the basic physical properties of the adhesive layer.

According to one embodiment of the present invention, the (meth)acrylate-based resin may also further include vinyl acetate, styrene, or acrylonitrile in order to improve other functionalities such as compatibility. As the (meth) acrylate-based resin further includes vinyl acetate, styrene or acrylonitrile as descried above, other functionalities such as compatibility may be improved.

According to one embodiment of the present invention, the singlet oxygen scavenger may be one selected from the group consisting of dimethyl anthracene (DMA), dibutyl anthracene (DBA), triethylsilylethynyl-pentacene, diphenylfuran (DPF), and combinations thereof. As the singlet oxygen scavenger is selected from those described above, it is possible to mitigate the oxygen inhibition phenomenon, thereby improving the success rate of chip pick-up.

According to one embodiment of the present invention, the content of the singlet oxygen scavenger in the adhesive composition may be 0.5 parts by weight to 20.0 parts by weight, 1.0 part by weight to 19 parts by weight, 2 parts by weight to 18 parts by weight, 3 parts by weight to 17 parts by weight, or 5 parts by weight to 16 parts by weight, based on 100 parts by weight of the adhesive binder. As the content of the singlet oxygen scavenger is controlled within the above-described above range, it is possible to mitigate the oxygen inhibition phenomenon, thereby improving the success rate of chip pick-up.

According to one embodiment of the present invention, the photosensitizer may be one selected from the group consisting of anthracene-based compounds, phenanthrene-based compounds, chrysene-based compounds, benzpyrene-based compounds, fluoranthene-based compounds, rubrene-based compounds, pyrene-based compounds, xanthone-based compounds, Indanthrene-based compounds, thioxanthen-9-one-based compounds, and combinations thereof. Preferably, the photosensitizer may be isopropyl thioxanthone. As the photosensitizer is selected from those described above, it is possible to control the efficiency of reaction of singlet oxygen with the singlet oxygen scavenger by controlling the rate at which atmospheric oxygen is converted into singlet oxygen by the photosensitizer upon UV irradiation. Specifically, the photosensitizer becomes an excited state by receiving energy upon UV irradiation, and the photosensitizer transfers energy to triplet oxygen ($^3O_2$), thus converting the triplet oxygen into singlet oxygen ($^1O_2$). Thereafter, the singlet oxygen scavenger may react with the singlet oxygen, thus reducing the oxygen inhibition phenomenon. The smaller the energy difference between the photosensitizer and the photoinitiator, the easier is the energy transfer between them, and thus the reaction proceeds efficiently.

According to one embodiment of the present invention, the content of the photosensitizer in the adhesive composition may be 0.1 parts by weight to 1.0 part by weight, 0.2 parts by weight to 0.9 parts by weight, 0.3 parts by weight to 0.8 parts by weight, 0.4 parts by weight to 0.7 parts by weight, or 0.5 parts by weight to 0.6 parts by weight, based on 100 parts by weight of the adhesive binder. As the content of the photosensitizer is controlled within the above-described range, it is possible to control the efficiency of reaction of singlet oxygen with the singlet oxygen scavenger by controlling the rate at which atmospheric oxygen is converted into singlet oxygen by the photosensitizer upon UV irradiation.

According to one embodiment of the present invention, the photoinitiator is not limited, and a conventional photoinitiator known in the related art may be used. The amount of photoinitiator used may be determined in consideration of the physical properties and characteristics of the adhesive layer formed and the kind and characteristics of the adhesive binder used.

According to one embodiment of the present invention, the content of the photoinitiator in the adhesive composition may be 0.1 parts by weight to 20 parts by weight, 1 part by weight to 19 parts by weight, 2 parts by weight to 18 parts by weight, 3 parts by weight to 17 parts by weight, 4 parts by weight to 16 parts by weight, 5 parts by weight to 15 parts by weight, 6 parts by weight to 14 parts by weight, 7 parts by weight to 13 parts by weight, 8 parts by weight to 12 parts by weight, or 9 parts by weight to 11 parts by weight, based on 100 parts by weight of the adhesive binder. As the content of the photoinitiator is controlled within the above-described range, the adhesive force at the interface between the adhesive layer and a layer adjacent thereto may be improved by increasing the efficiency of radical generation by UV irradiation, and the transfer of unreacted photoinitiator to a layer adjacent to the adhesive layer may be prevented from occurring.

According to one embodiment of the present invention, the photoinitiator may include one selected from the group consisting of benzoin and its alkyl ethers, acetophenones, anthraquinones, thioxanthones, ketals, benzophenones, α-aminoacetophenones, acylphosphine oxides, oxime esters, and combinations thereof. As the photoinitiator is selected from those described above, the adhesive force at the interface between adhesive layers may be improved by increasing the efficiency of radical generation by UV irradiation, and the transfer of unreacted photoinitiator to the adhesive layer may be prevented from occurring.

According to one embodiment of the present invention, the adhesive composition for a dicing tape may further include one selected from the group consisting of a curing agent, a solvent and a mixture thereof. As the adhesive composition for a dicing tape further includes one selected from among a curing agent, a solvent and a mixture thereof as described above, it is possible to control the curing rate of the adhesive composition for a dicing tape while improving the workability of the composition.

According to one embodiment of the present invention, the curing agent may include one or more selected from the group consisting of isocyanate-based compounds, aziridine-based compounds, epoxy-based compounds, and metal chelate-based compounds. As the curing agent is selected from those described above, it is possible to control the curing rate and prevent the physical properties of the adhesive layer from changing.

According to one embodiment of the present invention, the amount of curing agent used may be determined in consideration of the physical properties and characteristics of the adhesive layer formed and the kind and characteristics of the adhesive binder used. The adhesive composition for forming the adhesive layer of a dicing tape according to the above embodiment may include the curing agent in an amount of 0.1 to 10 parts by weight based on 100 parts by weight of the adhesive binder.

According to one embodiment of the present invention, the solvent may be an organic solvent. The organic solvent may include one selected from the group consisting of alcohols, ethers, acetates, ketones, and combinations thereof.

One embodiment of the present invention may provide a dicing tape including: a base film; and an adhesive layer formed on at least one surface of the base film, wherein the adhesive layer includes the adhesive composition for a dicing tape according to the above-described embodiment.

The dicing tape according to one embodiment of the present invention may improve the success rate of chip pick-up, by including the adhesive composition for a dicing tape in the adhesive layer.

According to one embodiment of the present invention, the base film is not limited to a specific type, and a plastic film or metal foil known in the art may be used as the base film. Alternatively, the base film may be one polymer film selected from the group consisting of a polyolefin film, a polyester film, a polycarbonate film, a polyvinyl chloride film, a polytetrafluoroethylene film, a polybutene film, a polybutadiene film, a vinyl chloride copolymer film, an ethylene-vinyl acetate copolymer film, an ethylene-propylene copolymer film, and an ethylene-alkyl acrylate copolymer film. For example, the base film may include low-density polyethylene, linear polyethylene, medium-density polyethylene, high-density polyethylene, ultra-low-density polyethylene, a polypropylene random copolymer, a polypropylene block copolymer, homopolypropylene, polymethylpentene, an ethylene-vinyl acetate copolymer, an ethylenemethacrylic acid copolymer, an ethylene-methyl methacrylate copolymer, an ethylene-ionomer copolymer, an ethylene-vinyl alcohol copolymer, polybutene, a styrene copolymer, or a mixture of two or more thereof. Here, the base film including the mixture of two or more polymers is meant to include all films having a structure in which two or more films including the above-described polymers, respectively, are stacked on each other, or single-layer films including two or more of the above-described polymers.

According to one embodiment of the present invention, the thickness of the base film is not particularly limited, the base film is generally formed to have a thickness of 10 μm to 200 μm, preferably 50 μm to 180 μm. If the thickness is less than 10 μm, controlling the depth of cutting in the dicing process cannot be stably achieved, and if the thickness is more than 200 μm, a large amount of burrs may occur in the dicing process, or the elongation of the film may decrease, and thus the expanding process may not be performed accurately.

According to one embodiment of the present invention, the base film may be subjected to conventional physical or chemical treatment, such as matting treatment, corona discharge treatment, primer treatment, or crosslinking treatment, if necessary.

The thickness of the adhesive layer may be 0.5 μm to 50 μm, or 5 μm to 30 μm.

According to one embodiment of the present invention, the contents related to the adhesive composition for a dicing tape included in the adhesive layer include all the contents described above with respect to the embodiment.

According to one embodiment of the present invention, as the dicing tape further includes the singlet oxygen scavenger in the adhesive layer, it is possible to mitigate the oxygen inhibition phenomenon by inducing the reduction of a peroxyl radical, whereby the decrease rate of the adhesive force of the adhesive layer after UV light irradiation relative to the initial adhesive force of the adhesive layer may be 20% to 80%. More specifically, as the dicing tape further includes the singlet oxygen scavenger in the adhesive layer, it is possible to mitigate the oxygen inhibition phenomenon by inducing the reduction of a peroxyl radical, whereby the decrease rate of the adhesive force of the adhesive layer after UV light irradiation under oxygen exposure conditions relative to the initial adhesive force of the adhesive layer may be 20% to 80%.

Hereinafter, the present invention will be described in detail with reference to examples. However, the examples according to the present invention may be modified into various different forms, and the scope of the present invention is not interpreted as being limited to the examples described below. The examples of the present invention are provided to more completely explain the present invention to those skilled in the art.

EXAMPLES AND COMPARATIVE EXAMPLES

Production of Die-Bonding Films, Dicing Tapes and Dicing Die-Bonding Films

Example 1

(1) Production of Die-Bonding Film

A composition composed of 90 g of a high-molecular-weight acrylic resin (Tg: 20° C.; and weight-average molecular weight: 850,000), 30 g of an epoxy resin (novolac-type epoxy resin; softening point: 94° C.), 20 g of a phenolic resin (phenol novolac resin; softening point: 94° C.) as a curing agent for the epoxy resin, 0.1 g of a medium temperature-initiation curing accelerator (2-methyl-imidazole), 0.5 of a high temperature-initiation curing accelerator (2-phenyl-4-methyl-imidazole), and 20 g of silica (average particle diameter: 75 nm) as a filler was mixed with methyl ethyl ketone under stirring.

The mixture was applied to a release-treated PET having a thickness of 38 μm, and was dried at 110° C. for 3 minutes, thereby producing a die-bonding film having a coating thickness of 20 μm.

(2) Production of Dicing Tape

An adhesive composition was prepared by adding about 3 g of a TDI-based isocyanate curing agent, 5 g of a photoinitiator (Irgacure 184), about 4.6 g of dimethyl anthracene (TCI, >98%, Mw: 106.28 g/mol), and 0.43 g of isopropyl thioxanthone to 100 g of a polymer resin (Mw: 700,000) obtained by adding 20 wt % of an acrylate functional group as a side chain to the main chain of an acrylate-based resin.

The adhesive composition was applied to a release-treated PET having a thickness of 38 μm, and was dried at 110° C. for 3 minutes to form an adhesive layer having a thickness of 10 μm. The formed adhesive layer was laminated on a polyolefin base film having a thickness of 90 μm, followed by aging, thereby producing a dicing tape.

(3) Production of Dicing Die-Bonding Film

The die-bonding film cut into a circular shape was transferred onto the produced dicing tape by lamination under a condition of 5 kgf/cm$^2$, thereby producing a dicing die-bonding film.

Example 2

A dicing die-bonding film was produced in the same manner as in Example 1, except that about 9.3 g of dimethyl anthracene and 0.43 g of isopropyl thioxanthone were used in the production of the dicing tape.

Example 3

A dicing die-bonding film was produced in the same manner as in Example 1, except that about 18.32 g of dimethyl anthracene and about 0.42 g of isopropyl thioxanthone were used in the production of the dicing tape.

Example 4

A dicing die-bonding film was produced in the same manner as in Example 1, except that, in the production of the dicing tape, about 1.1 g of triethylsilylethynyl-pentacene (TCI) was used instead of dimethyl anthracene and about 0.43 g of isopropyl thioxanthone was used.

Example 5

A dicing die-bonding film was produced in the same manner as in Example 1, except that, in the production of the dicing tape, about 3.60 g of triethylsilylethynyl-pentacene (TCI) was used instead of dimethyl anthracene and about 0.43 g of isopropyl thioxanthone was used.

Example 6

A dicing die-bonding film was produced in the same manner as in Example 1, except that about 18.32 g of dimethyl anthracene and about 0.42 g of an anthracene-based photosensitizer were used in the production of the dicing tape.

Comparative Example 1

A dicing die-bonding film was produced in the same manner as in Example 1, except that dimethyl anthracene and isopropyl thioxanthone were not used in the production of the dicing tape.

Comparative Example 2

A dicing die-bonding film was produced in the same manner as in Example 1, except that about 0.3 g of dimethyl anthracene and about 0.3 g of isopropyl thioxanthone were used in the production of the dicing tape.

Comparative Example 3

A dicing die-bonding film was produced in the same manner as in Example 1, except that, in the production of the dicing tape, 1.1 g of triethylsilylethynyl-pentacene (TCI) was used instead of dimethyl anthracene and isopropyl thioxanthone was not used.

Comparative Example 4

A dicing die-bonding film was produced in the same manner as in Example 1, except that about 25 g of dimethyl anthracene and about 0.43 g of isopropyl thioxanthone were used in the production of the dicing tape.

Comparative Example 5

A dicing die-bonding film was produced in the same manner as in Example 1, except that about 18.3 g of dimethyl anthracene and about 0.42 g of a naphthalene-based photosensitizer were used in the production of the dicing tape.

TEST EXAMPLES

For the dicing die-bonding films of the Examples and the Comparative Examples, the physical properties of each die-bonding film were evaluated according to the method described below, and the results of the evaluation are shown in Tables 1 and 2 below.

Test Example 1

Measurement of Adhesive Force

The dicing die-bonding films produced in Examples and the Comparative Examples were cut to a width of 25 mm, thereby preparing samples for measuring adhesive force.

For each of the prepared samples, the force (gf/inch) to peel the die-bonding film from the dicing tape at a peeling speed of 300 mm/min and a peeling angle of 180° was measured using a texture analyzer (TA Instrument). According to this method, the initial adhesive force was measured and the adhesive force after irradiating the base surface of the dicing tape with UV light at a dose of 150 mJ/cm$^2$ (illumination density: 70 mW/cm$^2$) was measured.

To simulate the oxygen exposure conditions, each of the prepared samples was peeled off, and then the base surface of the dicing tape was irradiated with UV light at a dose of 150 mJ/cm$^2$ (illumination density: 70 mW/cm$^2$). Then, the dicing tape and the die-bonding film were laminated with each other and the adhesive force between them was measured. The results of the measurement are shown in Tables 1 and 2 below.

Test Example 2

Measurement of Decrease Rate of Adhesive Force

Based on the initial adhesive force and the adhesive force under oxygen exposure conditions, obtained in Test Example 1, the decrease rate of the adhesive force was calculated. The results of the calculation are shown in Tables 1 and 2 below.

Test Example 3

Evaluation of Pick-up Performance and Measurement of 100% Pick-up Needle Pin Height After the release film of the dicing die-bonding film produced in each of the Examples and the Comparative Examples was peeled off, the die-bonding surface was mounted on a mirror wafer (8 inches; 35 μm thickness) at a temperature of 70° C., and then dicing was performed under the conditions described below so that the chip size was 13.3 mm×9.1 mm.

Thereafter, for each diced sample, the base surface of the dicing tape was irradiated with UV light at a dose of 150 mJ/cm$^2$ (illumination density: 70 mW/cm$^2$), and then the dicing tape was peeled off and laminated again. Following this, an expanding process was performed using a low-temperature chamber and a heat shrinking device, thereby preparing pick-up measurement samples.

For the prepared samples, pick-up was performed using SPA-400 (SHINKAWA) under the conditions described below, and the results are shown in Tables 1 and 2 below.

Specifically, regarding criteria for evaluation of chip pick-up performance, the needle pin height at which all individual chips were picked up was measured up elevation, and evaluation was made according to the following criteria: O: all (100%) the chips were picked up (the die was peeled off from the wafer) at a needle pin height of 0.2 mm or less; and X: the above condition was not satisfied. In addition, the 100% pick-up needle pin height, which is the height of the pin at which 100% of chips are picked, was measured.

Dicing Conditions
Instrument: DFD-6361 (DISCO)
Blade type: 27HEBB (DISCO)
Cutting blade height (cut depth): 80 μm
Dicing speed: 15 mm/s
Blade rotational speed: 45,000 rpm
Pick-Up Conditions
Instrument: SPA-400 (SHINKAWA)
Expanding height: 3 mm
Number of needles: 10
Needle plunge-up height: 0.2 mm
Needle plunge-up speed: 10 mm/s

TABLE 1

| | Example 1 | Example 2 | Example 3 | Example 4 | Example 5 | Example 6 |
|---|---|---|---|---|---|---|
| Initial adhesive force (gf/inch) | 480 | 486 | 475 | 481 | 483 | 485 |
| Adhesive strength (gf/inch) after UV irradiation | 10.1 | 10.3 | 9.7 | 10.3 | 9.9 | 10.0 |

TABLE 1-continued

|  | Example 1 | Example 2 | Example 3 | Example 4 | Example 5 | Example 6 |
|---|---|---|---|---|---|---|
| Adhesive force (gf/inch) after UV irradiation under oxygen exposure conditions | 375 | 360 | 353 | 378 | 374 | 315 |
| Decrease rate (%) of adhesive force after UV irradiation under oxygen exposure conditions | 22 | 26 | 26 | 21 | 23 | 35 |
| Pick-up performance | 0 | 0 | 0 | 0 | 0 | 0 |
| 100% Pick-up needle pin height (mm) | 0.20 | 0.20 | 0.15 | 0.20 | 0.18 | 0.10 |

TABLE 2

|  | Comparative Example 1 | Comparative Example 2 | Comparative Example 3 | Comparative Example 4 | Comparative Example 5 |
|---|---|---|---|---|---|
| Initial adhesive force (gf/inch) | 478 | 480 | 473 | 486 | 457 |
| Adhesive strength (gf/inch) after UV irradiation | 11.2 | 11.3 | 11.6 | 10.9 | 9.3 |
| Adhesive force (gf/inch) after UV irradiation under oxygen exposure conditions | 413 | 403 | 405 | 405 | 351 |
| Decrease rate (%) of adhesive force after UV irradiation under oxygen exposure conditions | 16 | 16 | 14 | 17 | 23 |
| Pick-up performance | X | X | X | X | X |
| 100% Pick-up needle pin height (mm) | 0.40 | 0.35 | 0.35 | 0.25 | 0.25 |

As shown in Tables 1 and 2 above, it can be seen that the decrease rate of the adhesive force of each of Examples 1 to 6 after UV irradiation under oxygen exposure conditions was significantly higher than that of Comparative Example 1. Thus, it can be seen that the pick-up performance was improved by mitigating the oxygen inhibition phenomenon, because the adhesive layer further included the singlet oxygen scavenger and the photosensitizer.

It can be seen that the decrease rate of the adhesive force of each of Examples 1 to 6 after UV irradiation under oxygen exposure conditions was significantly higher than that of Comparative Example 3. Thus, it can be seen that the pick-up performance was improved by mitigating the oxygen inhibition phenomenon, because the adhesive layer included both the singlet oxygen scavenger and the photosensitizer.

It can be seen that the decrease rate of the adhesive force of each of Examples 1 to 3 after UV irradiation under oxygen exposure conditions was significantly higher than that of Comparative Examples 2 and 4. Thus, it can be seen that the oxygen inhibition phenomenon was further mitigated, because the adhesive layer included 0.5 parts by weight to 20.0 parts by weight of the singlet oxygen scavenger.

It can be seen that, when chip pick-up was performed after UV irradiation under oxygen exposure conditions, the 100% pick-up needle pin height in the case of each of Examples 1 to 6 decreased compared to that in the case of Comparative Example 5. This suggests that the pick-up performance in the case of each of Examples 1 to 6 was improved by mitigating the oxygen inhibition phenomenon. In addition, it was confirmed that, when the naphthalene-based photosensitizer which is not the photosensitizer of the present invention was used, the pick-up performance deteriorated.

As described above, as the adhesive composition for a dicing tape according to one embodiment of the present invention further includes the singlet oxygen scavenger and the photosensitizer, the photosensitizer may convert atmospheric oxygen into singlet oxygen upon UV irradiation, and the singlet oxygen scavenger may react with the singlet oxygen, thereby mitigating the oxygen inhibition phenomenon.

As the dicing tape according to one embodiment of the present invention includes the adhesive composition for a dicing tape in the adhesive layer, it may prevent the success rate of chip pick-up from decreasing.

The effects of the present invention are not limited to the above-mentioned effects, and effects which are not mentioned will be clearly understood by those skilled in the art from the present specification.

Although the present invention has been described above with respect to the limited embodiments, the present invention is not limited to these embodiments. Those skilled in the art will appreciate that various modifications and variations are possible without departing from the technical spirit of the present invention and the appended claims and equivalents thereto.

What is claimed is:

1. An adhesive composition for a dicing tape comprising: an adhesive binder; a singlet oxygen scavenger; a photosensitizer; and a photoinitiator,
    wherein the singlet oxygen scavenger is one selected from the group consisting of dimethyl anthracene (DMA), triethylsilylethynyl-pentacene, and combinations thereof, and
    wherein the singlet oxygen scavenger is comprised in an amount of 1.1 parts by weight to 20.0 parts by weight based on 100 parts by weight of the adhesive binder.

2. The adhesive composition of claim 1, wherein the adhesive binder comprises a (meth)acrylate-based resin having a glass transition temperature of −28° C. to −58° C.

3. The adhesive composition of claim 2, wherein the (meth)acrylate-based resin comprises a copolymer of a (meth)acrylic ester-based monomer and a crosslinkable functional group-containing monomer.

4. The adhesive composition of claim 1, wherein the photosensitizer is one selected from the group consisting of anthracene-based compounds, phenanthrene-based compounds, chrysene-based compounds, benzpyrene-based compounds, fluoranthene-based compounds, rubrene-based compounds, pyrene-based compounds, xanthone-based compounds, indanthrene-based compounds, thioxanthen-9-one-based compounds, and combinations thereof.

5. The adhesive composition of claim 1, wherein
the photosensitizer is comprised in an amount of 0.1 parts by weight to 1.0 parts by weight based on 100 parts by weight of the adhesive binder.

6. The adhesive composition of claim 1, wherein the photoinitiator is one selected from the group consisting of benzoin and its alkyl ethers, acetophenones, anthraquinones, thioxanthones, ketals, benzophenones, α-aminoacetophenones, acylphosphine oxides, oxime esters, and combinations thereof.

7. The adhesive composition of claim 1, wherein the adhesive composition further comprises one selected from the group consisting of a curing agent, a solvent, and a mixture thereof.

8. The adhesive composition of claim 3, wherein the (meth)acrylic ester based monomer is at least one selected from the group consisting of pentyl (meth)acrylate, n-butyl (meth)acrylate, ethyl (meth)acrylate, methyl (meth)acrylate, hexyl (meth)acrylate, n-octyl (meth)acrylate, isooctyl (meth)acrylate, 2-ethylhexyl (meth)acrylate, dodecyl (meth)acrylate, and decyl (meth)acrylate.

9. The adhesive composition of claim 3, wherein the crosslinkable functional group-containing monomer is at least one monomer selected from the group consisting of a hydroxyl group-containing monomer, a carboxyl group-containing monomer and a nitrogen-containing monomer.

10. A dicing tape comprising:
a base film; and an adhesive layer provided on at least one surface of the base film,
wherein the adhesive layer comprises the adhesive composition for a dicing tape according to claim 1.

11. The dicing tape of claim 10, wherein a decrease of an adhesive force of the adhesive layer after UV irradiation under oxygen exposure conditions relative to an initial adhesive force of the adhesive layer is 20% to 80%.

12. The dicing tape of claim 10, wherein the base film is one polymer film selected from the group consisting of a polyolefin film, a polyester film, a polycarbonate film, a polyvinyl chloride film, a polytetrafluoroethylene film, a polybutene film, a polybutadiene film, a vinyl chloride copolymer film, an ethylene-vinyl acetate copolymer film, an ethylene- propylene copolymer film, and an ethylene-alkyl acrylate copolymer film.

* * * * *